(12) United States Patent
Ma

(10) Patent No.: US 7,588,442 B2
(45) Date of Patent: Sep. 15, 2009

(54) LAND GRID ARRAY CONNECTOR

(75) Inventor: Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/228,976

(22) Filed: Aug. 18, 2008

(65) Prior Publication Data

US 2009/0047807 A1 Feb. 19, 2009

(30) Foreign Application Priority Data

Aug. 17, 2007 (CN) .................... 2007 2 0042940 U

(51) Int. Cl.
*H01R 13/62* (2006.01)
(52) U.S. Cl. ....................... 439/73; 439/331
(58) Field of Classification Search .................. 439/73, 439/331, 71, 525, 526
See application file for complete search history.

(56) References Cited

U.S. PATENT DOCUMENTS

| 7,097,464 | B1* | 8/2006 | McHugh et al. | ............... 439/73 |
|---|---|---|---|---|
| 7,128,593 | B2* | 10/2006 | Ma | ............... 439/331 |
| 7,179,092 | B2* | 2/2007 | Ma | ............... 439/73 |
| 7,189,094 | B2* | 3/2007 | Ma | ............... 439/331 |
| 2005/0124188 | A1* | 6/2005 | Ma | ............... 439/73 |
| 2006/0116006 | A1* | 6/2006 | Ma | ............... 439/71 |
| 2006/0178021 | A1* | 8/2006 | McHugh et al. | ............... 439/73 |

* cited by examiner

*Primary Examiner*—Gary F. Paumen
(74) *Attorney, Agent, or Firm*—Wei Te Chung

(57) ABSTRACT

An LGA connector (100) comprises an insulative housing (20) defining a plurality of side surfaces (21), a stiffener (30) surrounding the insulative housing (20) and comprising a bottom plate (31) and a plurality of sidewalls (33) extending upwardly from the bottom plate (31), the bottom plate (31) defining a window (313) for accommodating the insulative housing (20), a clip (40) pivotally engaged to one end of the stiffener (30) and comprising a main plate (41) and a pair of side plates (411) extending from the two opposite sides of the main plate (41), and a lever (50) engaged to the other end of the stiffener (30) for fastening the clip (40). Each side surface (21) and corresponding sidewall (33) define a gap therebetween for accommodating the side plate (411) and the bottom plate (31) defines a pair of slots (314) connected with the window (313).

12 Claims, 5 Drawing Sheets

LAND GRID ARRAY CONNECTOR

BACKGROUND OF THE INVENTION

1. Field of the Invention

The present invention relates to an electrical connector for electrically connecting an electronic package such as an integrated circuit (IC) chip with a circuit substrate such as a printed circuit board (PCB), and particularly to an land grid array connector adapted for receiving an land grid package (LGP) therein and electrically connecting the LGP with a PCB.

2. Description of the Prior Art

Land grid array (LGA) connector for electrically connecting a Land Grid Package (LGP) with a printed circuit board (PCB) is widely used in the field of electrical connectors. The LGA connector typically comprises an insulative housing, a stiffener defined around the insulative housing, a clip pivotally engaged on one end of the stiffener, and a lever engaged on the other end of the stiffener for fastening the clip onto the insulative housing. The LGP is clasped between the clip and the insulative housing.

Referring to FIGS. 4-5 a conventional Land Grid Array (LGA) connector is illustrated. The LGA connector 6 comprises an insulative housing 61, a stiffener 62 defined around the insulative housing 61, a metal clip 63 pivotally engaged on one end of the stiffener 62, and a lever 64 engaged on the other end of the stiffener 62 for fastening the clip 63 onto the insulative housing 61. The stiffener 62 comprises a bottom plate 621 and four sidewalls 622 extending upwardly from the bottom plate 621. The lever 64 is pivotally connected to one sidewall 622 of the stiffener 62 and the clip 63 is pivotally connected to the other sidewall of the stiffener 62 in a moveable manner. The insulative housing 61 is mounted on the bottom plate 621 of the stiffener 62 with a gap (not shown) between a side surface of the insulative housing 61 and corresponding sidewall 622 of the stiffener 62. The clip 63 has a substantially rectangular configuration, with a window (not labeled) in the middle thereof. The clip 63 comprises a pair of pressing plates 630 and a pair of side plates 632 extending downwardly from each outer edge of the pressing plate 630 respectively, the pressing plates 630 bend downwardly. The lever 64 comprises an operation lever 641 and a perpendicular pressing lever 642 for pressing the clip 63 to clasp the LGP 7 between the clip 63 and the insulative housing 61.

In use, the clip 63 is first rotated to a vertical open position, and the LGP 7 is seated onto a predetermined position of the insulative housing 61. Then the clip 63 is rotated to a horizontal closed position. When the two middle portions of the pressing plate 630 of the clip 63 are fittingly rested on LGP 7, the side plate 632 goes into the gap between the side surface of the insulative housing 61 and corresponding sidewall 622. When the operation lever 641 is subsequently actuated, the pressing lever 642 presses on one end of the clip 63. Therefore fastening the LGP 7 between the stiffener 62 and the clip 63.

Because the clip 63 is connected to the stiffener 62 in a moveable manner, the clip 63 is likely to move on the stiffener 62 before the pressing portion 642 is rotated downwardly for fastening one end of the clip 63. As a consequence, the two middle portions of the pressing plate 630 of the clip 63 will engage on the LGP 7 at an improper position, not at the predetermined middle position of the LGP 7. In result, when the pressing lever 642 is rotated downwardly for pressing one end of the clip 63, the LGP 7 will tilt, even be damaged because of being pressed at an improper position by the pressing plate 630.

In view of the above, a new LGA connector which overcomes the above-mentioned disadvantages is desired.

SUMMARY OF THE INVENTION

Accordingly, an object of the present invention is to provide an LGA connector that can prevent the land grid chip (LGP) from tilting or being damaged when the LGP is being sandwiched in the LGA connector, therefore ensuring a reliability electrical connection performance between the LGP and the LGA connector.

To achieve the above-mentioned object, an LGA connector in accordance with the present invention comprises an insulative housing defining a plurality of side surfaces, a stiffener surrounding the insulative housing and comprising a bottom plate and a plurality of sidewalls extending upwardly from the bottom plate, the bottom plate defining a window for accommodating the insulative housing, a clip pivotally engaged to one end of the stiffener and comprising a main plate and a pair of side plates extending from the two opposite sides of the main plate, and a lever engaged to the other end of the stiffener for fastening the clip. Each side surface and corresponding sidewall define a gap therebetween for accommodating the side plate and the bottom plate defines a pair of slots connected with the window.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
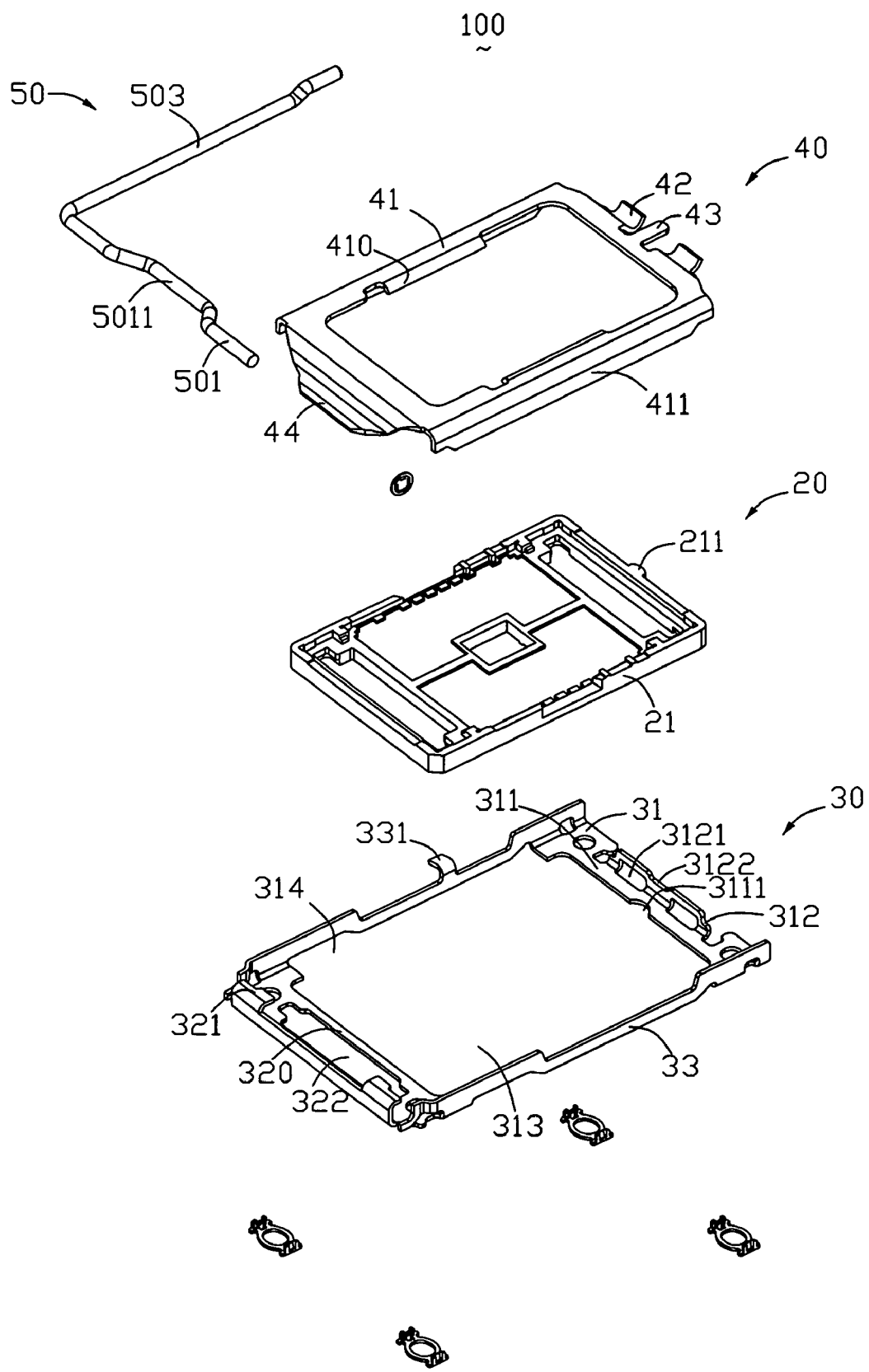
FIG. 1 is an exploded, isometric view of an land grid array connector in accordance with the embodiment of the present invention.

Referring to FIG. 1, a land grid array connector 100 in accordance with the embodiment of the present invention comprises an insulative housing 20, a stiffener 30 surrounding the insulative housing 20, a metal clip 40 pivotally engaged on one end of the stiffener 30 in a moveable manner, and a lever 50 pivotally engaged on the other end of the stiffener 30.

The insulative housing 20 has a substantially rectangular configuration with a plurality of side surfaces 21. A plurality of passageways (not labeled) are defined in the insulative housing 20 for receiving a corresponding number of electrical contacts (not labeled) therein. The side surface 21 defines a protruding portion 211 with a semicircle shape.

The stiffener 30 comprises a bottom plate 31, two sidewalls 33 extending upwardly from the bottom plate 31 and a pair of slots 314 formed by the bottom plate 31 along the sidewalls 33. The bottom plate 31 comprises a first end 311, a second end 320 and a window 313 formed by the first end 311 and the second end 320. The first end 311 defines a recess 3111 with a semicircle shape extending to the inner of the first end 311 for matching with the protruding portion 211 of the insulative housing 20. The slot 314 and the recess 3111 are both connected with the window 313. The first end 311 also defines a locking portion 312 extending upwardly from the first end 311. The locking portion 312 defines a pair of locking holes 3121 and a locking recess 3122 between the locking holes 3121. The second end 320 comprises a notch 320a and a pair of locking slice 321 extending curvedly from the second end 320. The sidewall 33 defines a interlocking portion 331.

The clip 40 also has a substantially rectangular configuration and comprises a pair of pressing plates 41 and a pair of side plates 411 extending downwardly from each outer edge of the pressing plate 41 respectively. The side plate 411 also has a substantially rectangular configuration with a long outer edge and the free end of the side plate 411 enters into the slot 314 of the stiffener 30 when the clip 40 is rotated to a horizontal closed position. A pair of hooks 42 and an anti-rotation bar 43 therebetween extend from one end of the pressing plate 41 for engaging with the locking holes 3121 and the locking recess 3122 of the stiffener 30, and an extending portion 44 extends from the other end of the pressing plate 41 for being pressed by the lever 50. A pair of clasping portions 410 bends toward the insulative housing 20 in a middle of the pressing plate 41 for pressing the LGP (not labeled).

The lever 50 comprises an operation lever 503 and a pressing lever 501 perpendicular to the operation lever 503. The pressing lever 501 is interlocked with the locking slice 321 of the stiffener 30 and defines a middle pressing portion 5011 for pressing on the extending portion 44 of the clip 40, therefore fastening the LPG between the insulative housing 20 and the clip 40.

Figure 2:
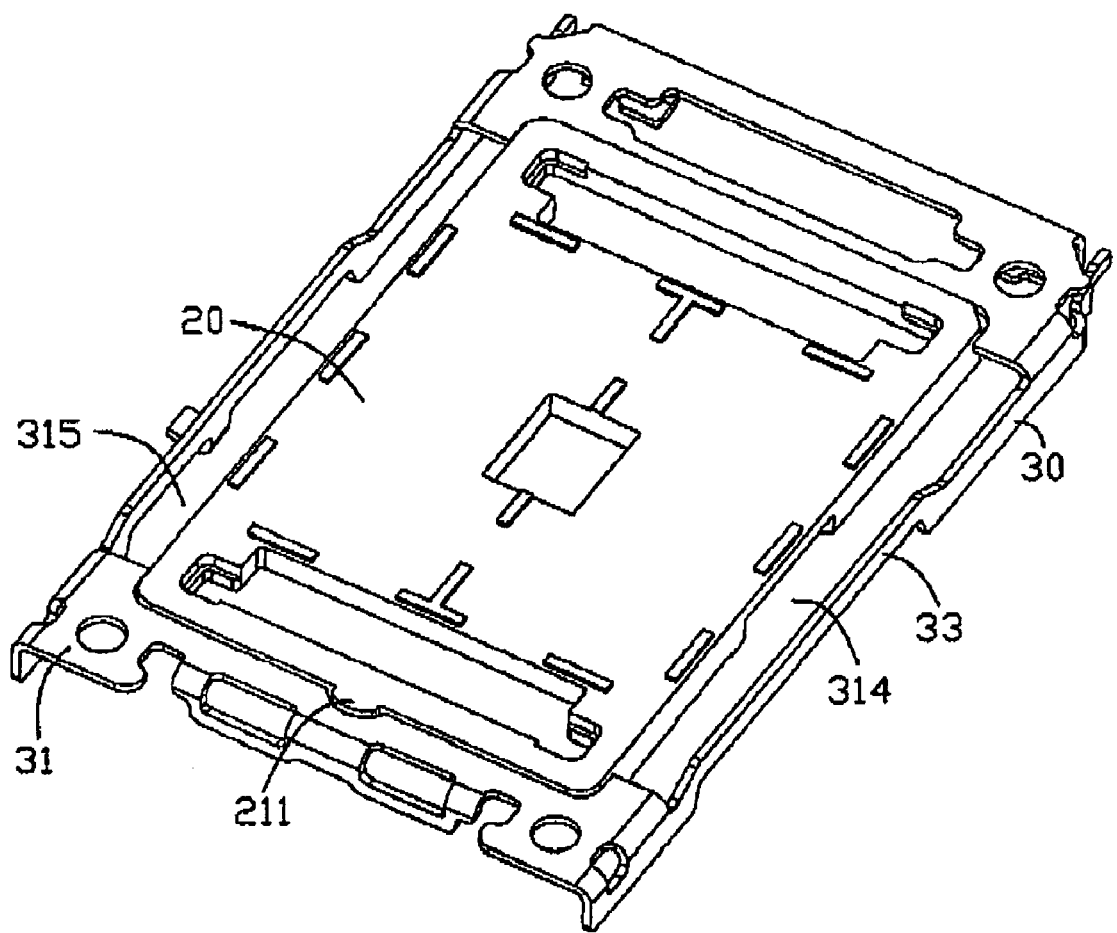
FIG. 2 is an inverted view of the assembled of the land grid array connector in FIG. 1, only showing the insulative housing being assembled with the stiffener.
Figure 3:
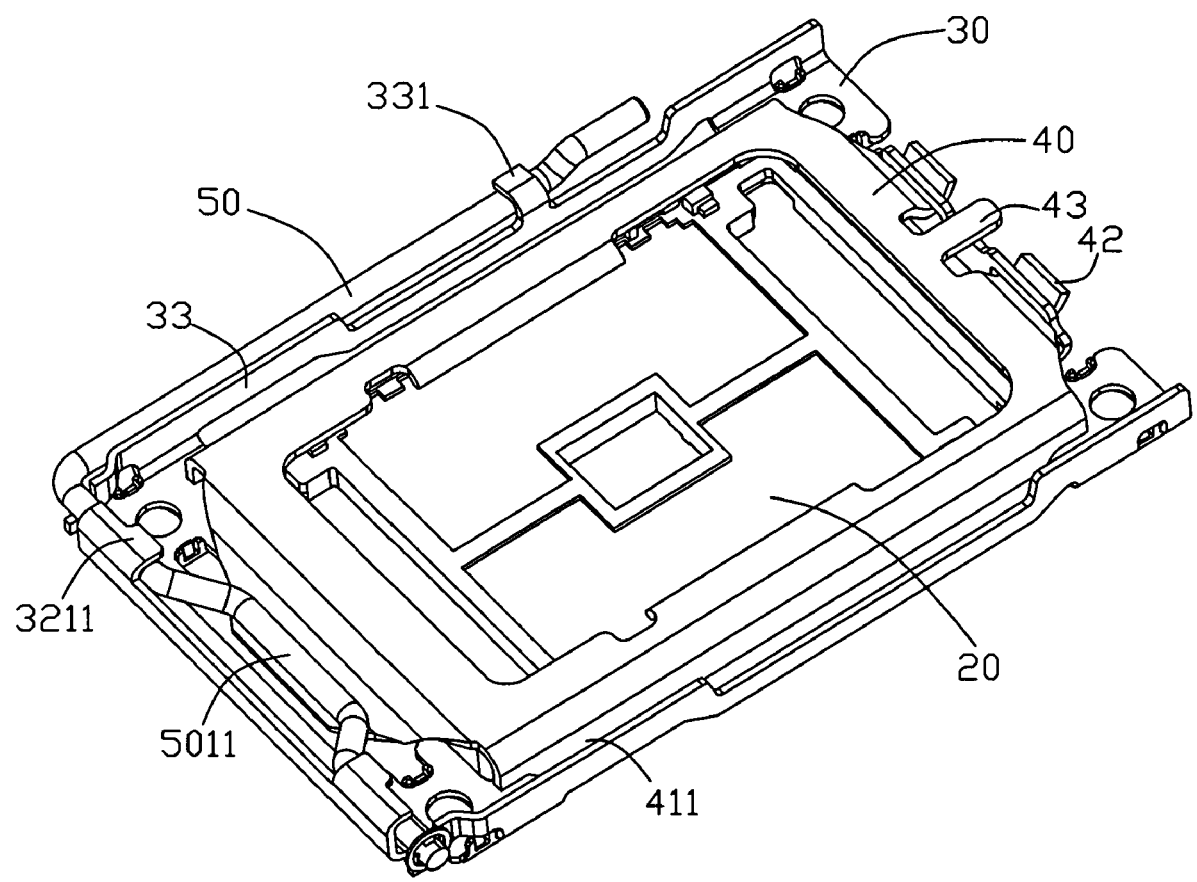
FIG. 3 is another assembled view of the land grid array connector of FIG. 1, showing the side plate of the clip being inserted into the slot of the stiffener partly.
Figure 4:
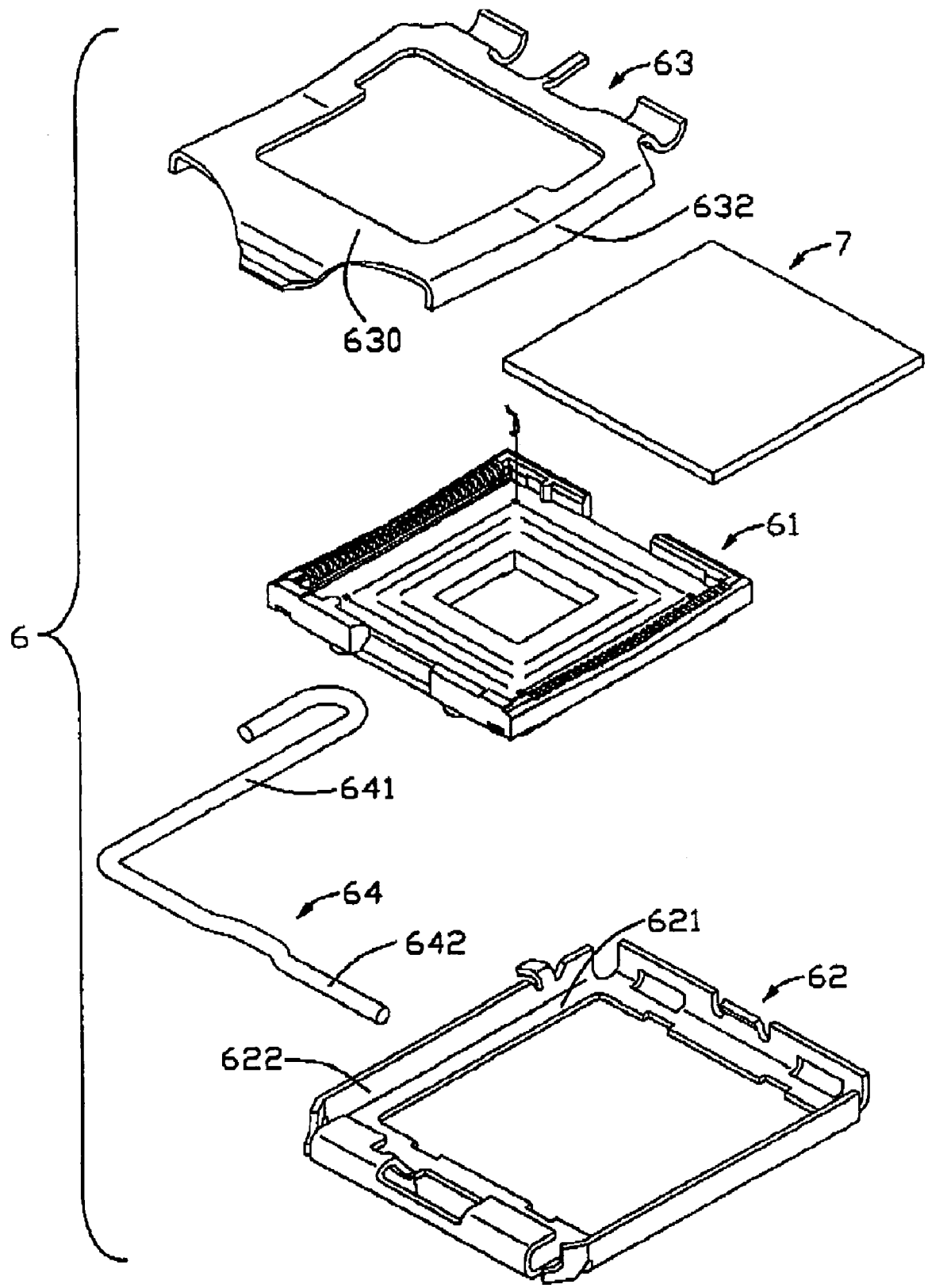
FIG. 4 is an exploded, isometric view of a conventional land grid array connector, together with a land grid package ready to be mounted onto the insulative housing of the land grid array connector.
Figure 5:
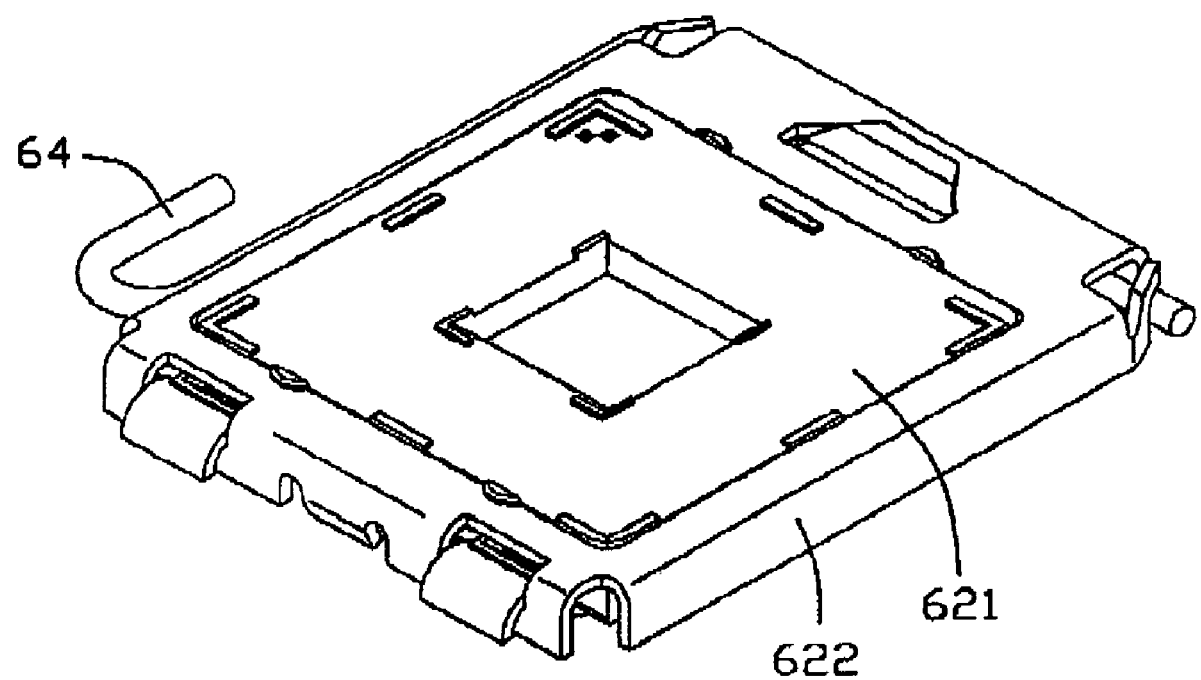
FIG. 5 is an inverted view of the assembled of the land grid array connector in FIG. 4.

Referring to FIGS. 2-3, after the connector 100 is assembled, the insulative housing 20 is mounted in the window 313 formed by the bottom plate 31, the protruding portion 211 is matched with the recess 3111, the sidewalls 33 and corresponding side surfaces 21 define a gap 315 therebetween for accommodating the side plate 411 of the clip 40. The clip 40 and the lever 50 are pivotally engaged to two opposite end of the stiffener 30 respectively.

When the connector 100 is in used, the LGP is disposed onto the insulative housing 20. The clip 40 is then rotated downwardly to a horizontal close position, and the free end of the side plates 411 enters into the corresponding slot 314 of the stiffener 30. When the lever 50 is actuated to press the extending portion 44 of the clip 40 downwardly, the extending portion 44 partly enters into the notch 322 of the clip 40. The notch 40 makes the extending portion 44 not interference with the stiffener 30. When the lever 50 is interlocked with the interlocking portion 331 of the stiffener 30, the clasping portions 410 of the clip 40 press the LGP down at a predetermined position, therefore the LGP is surely sandwiched in the connector 100.

Because the slot 314 is connected with the window 313, when the clip 40 is pressed downwardly by the lever 50, the side plate 411 can be located near the side surface 21 of the insulative housing 20 and the free ends of the side plates 411 will enter into said slot 314, thus the clip 40 will not interference with the stiffener 30 and can no longer move freely on the stiffener 30 in the horizontal direction, that will promise that the clasping portions 410 of the clip 40 can press on the LGP at a predetermined proper position, therefore ensuring a reliability electrical connection performance between the LGP and the connector 100.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A land grid array connector for interconnecting a land grid package and a circuit substrate, comprising:
   an insulative housing comprising a plurality of side surfaces;
   a stiffener surrounding the insulative housing and comprising a bottom plate and a pair of sidewalls extending upwardly from the bottom plate, the bottom plate defining a window for accommodating the insulative housing;
   a clip pivotally engaged to one end of the stiffener and comprising a main plate and a pair of side plates extending from two opposite sides of the main plate; and
   a lever engaged to the other end of the stiffener for fastening the clip;
   wherein each side surface and corresponding sidewall define a gap therebetween for accommodating the side plate and the bottom plate defines a pair of slots connected with the window and located between the insulative housing and the sidewalls of the stiffener.

2. The land grid array connector as claimed in claim 1, wherein the slot is extending along the sidewall of the stiffener.

3. The land grid array connector as claimed in claim 1, wherein the side plate enters into said slot when the clip is fastened by the lever.

4. The land grid array connector as claimed in claim 1, wherein the main plate includes a pair of clasping portions for pressing the land grid package, a pair of hooks engaging with the stiffener and an anti-rotation bar between the hooks.

5. A land grid array connector for interconnecting a land grid package and a circuit substrate comprising:
   an insulative housing comprising a plurality of side surfaces;
   a stiffener surrounding the insulative housing and comprising a first sidewall, a second sidewall, two connection portions connected the first sidewall with the second sidewall and an opening formed by the first sidewall, the second sidewall and the connection portions;
   a clip mounted on the first sidewall of the stiffener in a moveable manner and comprising a main plate and at least one side plate extending downwardly from one side of the main plate; and
   a lever mounted on the second sidewall of the stiffener for fastening the clip;
   wherein the opening includes a window adapted to receive the insulative housing and a pair of slots at opposite sides of the insulative housing and communicated with the window.

6. The land grid array connector as claimed in claim 5, wherein the side plate enters into said slot at least partly when the clip is fastened by the lever.

7. The land grid array connector as claimed in claim 5, wherein the first end defines a first main plate.

8. The land grid array connector as claimed in claim 7, wherein the second end defines a second main plate coplanar with the first main plate.

9. The land grid array connector as claimed in claim 8, wherein the connection portion is perpendicular with the first main plate.

10. A land grid array connector comprising:
- a metallic stiffener defining an opening surrounded by a pair of opposite first sides and a pair of opposite second sides;
- an insulative housing received in said opening and defining a pair of opposite third sides retainably engaged with the corresponding pair of first sides, and a pair of opposite fourth sides confronting while being spaced from the corresponding pair of second sides with slots, respectively; and
- a load plate pivotally mounted to the stiffener and defining a pair of opposite fifth sides respectively located between said pair of second sides and said pair of fourth sides and received in the corresponding slots, respectively.

11. The land grid array connector as claimed in claim 10, wherein each of said fifth sides is closer to the corresponding second side that to the corresponding fourth side.

12. The land grid array connector as claimed in claim 10, wherein the stiffener defines a plurality of screw holes surrounding the opening.

\* \* \* \* \*